United States Patent
Lin et al.

(10) Patent No.: US 8,999,849 B1
(45) Date of Patent: Apr. 7, 2015

(54) METHOD OF FABRICATING III-NITRIDE BASED SEMICONDUCTOR ON PARTIAL ISOLATED SILICON SUBSTRATE

(71) Applicant: National Tsing Hua University, Hsinchu (TW)

(72) Inventors: Yu-Syuan Lin, Changhua County (TW); Shuo-Hung Hsu, Hsinchu (TW); Yi-Wei Lien, New Taipei (TW)

(73) Assignee: National Tsing Hua University, Hsinchu (TW)

( * ) Notice: Subject to any disclaimer, the term of this patent is extended or adjusted under 35 U.S.C. 154(b) by 25 days.

(21) Appl. No.: 14/093,694

(22) Filed: Dec. 2, 2013

(30) Foreign Application Priority Data

Oct. 7, 2013 (TW) .............................. 102136251 A

(51) Int. Cl.
  *H01L 21/3065* (2006.01)
  *H01L 21/306* (2006.01)

(52) U.S. Cl.
  CPC ...... *H01L 21/3065* (2013.01); *H01L 21/30604* (2013.01)

(58) Field of Classification Search
  None
  See application file for complete search history.

(56) References Cited

U.S. PATENT DOCUMENTS

| | | | |
|---|---|---|---|
| 7,436,039 B2 * | 10/2008 | Zhu et al. | 257/484 |
| 7,989,277 B1 * | 8/2011 | Luh et al. | 438/167 |
| 8,368,119 B1 * | 2/2013 | Luh et al. | 257/192 |
| 8,796,734 B2 * | 8/2014 | Lochtefeld et al. | 257/190 |
| 8,860,160 B2 * | 10/2014 | Cheng et al. | 257/427 |
| 8,878,243 B2 * | 11/2014 | Lochtefeld | 257/190 |
| 2009/0035925 A1 * | 2/2009 | Zhu et al. | 438/534 |
| 2011/0006307 A1 * | 1/2011 | Chen et al. | 257/76 |
| 2011/0101371 A1 * | 5/2011 | Zhu et al. | 257/76 |
| 2013/0210220 A1 * | 8/2013 | Chu et al. | 438/507 |
| 2014/0001560 A1 * | 1/2014 | Cappellani et al. | 257/368 |
| 2014/0167114 A1 * | 6/2014 | Derluyn et al. | 257/194 |

\* cited by examiner

*Primary Examiner* — Allan Olsen
(74) *Attorney, Agent, or Firm* — Jackson IPG PLLC

(57) ABSTRACT

A semiconductor is fabricated on a silicon (Si) substrate. The semiconductor is III-nitride based. The Si substrate is partially isolated. Etching is directly processed from top on a chip for solving wire-width problem. The Si substrate does not need to be made thin. The chip can be large scaled and be prevented from bowing. Thus, the present invention simplifies producing procedure and reduces production cost. Besides, for a large-scaled chip, the breakdown voltage is enhanced; and, without making the Si substrate thin, the on-state current is remained the same and the heat problem is weakened.

10 Claims, 17 Drawing Sheets

METHOD OF FABRICATING III-NITRIDE BASED SEMICONDUCTOR ON PARTIAL ISOLATED SILICON SUBSTRATE

TECHNICAL FIELD OF THE INVENTION

The present invention relates to fabricating a III-nitride based semiconductor; more particularly, relates to directly etching a chip from top without substrate transferring technique or deep-etching a silicon (Si) substrate from back-side for solving line width problem, where the Si substrate does not need to have substrate thinning process for solving the problem of complex fabrication procedure and the severe bowing problem of large-scaled chip.

DESCRIPTION OF THE RELATED ARTS

Semiconductor devices of gallium nitride (GaN) and other metal nitride (such as: aluminium nitride (AlN), and indium nitride (InN)) have characteristics of high output current density, high withstand voltage and high power output to be widely used in high frequency components and power devices. In recent years, the advance of epitaxy technology enables GaN components showing its excellent characteristics on being grown with sapphire, silicon carbide and Si substrates. As comparing to the other substrate, growing a GaN device on a large-scaled Si substrate has great advantages, such as good thermal dissipation effect and significant manufacturing cost reduction, and opportunity on integrating existing advanced Si manufacture procedures.

However, growing a heterojunction nitride device on a Si substrate still has the following problems:

1. The withstand voltage has a value far from ideal. According to a theoretical calculation, GaN should be able to bear a breakdown electric field up to about 3.3 MV/cm (where the value for silicon material is about 0.3 MV/cm). With a heterojunction nitride Schottky diode, a linear growth trend of breakdown voltage is found as following the increase of lateral drift length (which has a slope about 100V/μm). But, following the increase of drift length on the Si substrate, the breakdown voltage of the nitride device will show a saturated trend and the breakdown voltage becomes worse than expected. The reason lies in that the heterogeneous junction between a nucleation layer (usually GaN, AlN or AlGaN) and the Si substrate will generate a parasitic channel owing to the band discontinuity, as shown in FIG. 9. When an anode (i.e. Schottky junction) has a large reverse bias, the parasitic channel forms a leaky path. Then, the Schottky junction generates electrons running to a cathode (i.e., ohmic contact) along the leaky path, which results in leakage current surge and early collapse at the Si substrate or between the Si substrate and the nucleation layer. Hence, when the nitride diode is operated under a large reverse bias (about several hundred volts) on the Si substrate, electrons may be easily flown from the anode through leaky path in lateral direction and the buffer layer/nucleation layer in vertical direction to the cathode to generate a large amount of vertical leakage current, where the vertical leakage current is the main cause for early collapse and loss.

2. For solving the above problems of breakdown voltage and leakage current, IMEC suggested in 2010 to process measurement after the Si substrate is completely etched out. As shown in FIG. 10, the silicon is completely etched out and, then, the device is transferred to another insulating substrate, where the breakdown voltage and the leakage current are found to have significant improvement. In FIG. 11, the output voltage current curve of the device in a close state (reverse bias at gate, normal bias at drain) is shown. The main reason is that, by etching out the Si substrate, the parasitic channels exist in the interface of nucleation layer and the Si substrate are removed as well. In addition, after the Si substrate is completely removed, a linear relation between the breakdown voltage and the drift area length (length between gate and drain) is found, as shown in FIG. 12. (Bin Lu, et al, "Breakdown mechanism in AlGaN/GaN HEMTs on Si substrate", Device Research Conference (DRC), 2010) However, this method still has a shortcoming: After the substrate is completely removed and the device is transferred to a glass substrate, the thermal dissipation problem will increase the on-state resistance and decrease the on-state output current, as shown in FIG. 13. (P. Strivastava, et al, "Silicon substrate removal of GaN DHFETs for enhanced (>1100 V) breakdown voltage", IEEE, Electron Device Letters, Vol. 31, No. 8, 2010). 118 lane 14 NO.

3. For solving the dissipation problem, IMEC suggested partial-etching silicon trench around drain in the meeting of IEDM, 2011. Only the drain below the Si substrate is etched, where the remaining Si substrate helps solving the dissipation problem (P. Srivastava, et al, "Si trench around drain STAD technology of GaN-DHFETs on Si substrate for boosting power performance" IEEE, International Electron Devices Meeting (IEDM), 2011). The IMEC method comprises the following steps:

(1) A Si substrate is polished and/or etched to be made thin to 50~100 μm.

(2) GaN on the Si substrate is transferred to another substrate, such as a glass substrate, through direct bonding.

(3) Exposed area is defined at the back-side of chip for deep etching to a depth of 50~100 μm of the Si substrate.

However, this method still has the following disadvantages:

1. The Si substrate at bottom of the chip is made thin by being polished and/or etched to about 50~100 μm for deep-etching the Si substrate. Yet, after this process, the chip is usually bowing. Serious bowing state will easily destroy epitaxial structure during process. Moreover, the production yield may be greatly lowered, especially for the large-scaled chips.

2. For transferring the substrate, direct bonding or flip chip is required on re-bonding.

3. Line width is not easy to be shrunken on deep-etching the Si substrate in the future.

Hence, the prior arts do not fulfill all users' requests on actual use.

SUMMARY OF THE INVENTION

The main purpose of the present invention is to directly etch a chip from top without substrate transferring technique or deep-etching a silicon (Si) substrate from back-side of chip.

Another purpose of the present invention is to solve the problem of complex fabrication procedure and the bowing problem of large-scaled chip without Si substrate thin-down process.

Another purpose of the present invention is to simplify fabrication procedure; to reduce production cost; to be compatible with modern procedures; and to be suitable for producing large-scaled chips with enhanced breakdown voltages, where the Si substrate does not need to be made thin and, therefore, the on-state output current is not lowered and the thermal dissipation problem becomes small.

To achieve the above purposes, the present invention is a method of fabricating a III-nitride based semiconductor on a partial isolated Si substrate, comprising steps of: (a) obtaining a diode device, comprising steps of: (a1)) obtaining a Si substrate and forming a nucleation layer on the Si substrate; a buffer layer on the nucleation layer; an active area on the buffer layer; and a channel layer located in the active area on the buffer layer, where the active area is isolated by an isolating part; (a2) forming a barrier layer on the channel layer; and (a3) forming an anode and a cathode on the barrier layer or the channel layer; and obtaining a drift area in the Si substrate between the anode and the cathode; (b) defining an etching area of the diode device and directly etching the diode device from top to etch out the barrier layer, the channel layer, the buffer layer, the nucleation layer and a part of the Si substrate, where the etching area is defined inside or outside the active area; and (c) processing an isotropic/non-isotropic lateral etching to the Si substrate until the drift area of the diode device. Accordingly, a novel method of fabricating a III-nitride based semiconductor on a partial isolated Si substrate is obtained.

BRIEF DESCRIPTIONS OF THE DRAWINGS

The present invention will be better understood from the following detailed descriptions of the preferred embodiments according to the present invention, taken in conjunction with the accompanying drawings, in which FIG. 1A is the sectional view showing the initial state of the diode device according to the present invention;

DESCRIPTION OF THE PREFERRED EMBODIMENTS

The following descriptions of the preferred embodiments are provided to understand the features and the structures of the present invention.

Figure 1A:
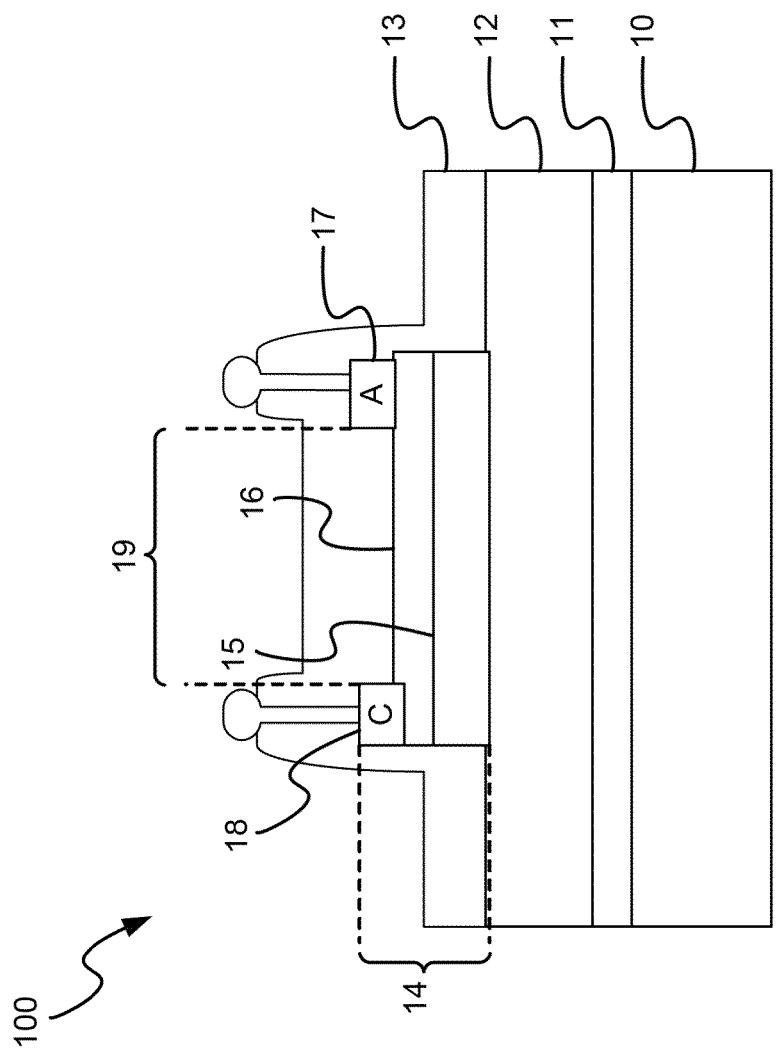
FIG. 1B is the sectional view showing the perpendicular etching of the first preferred embodiment according to the present invention.
FIG. 1C is the sectional view showing the lateral etching of the first preferred embodiment.
Figure 1B:
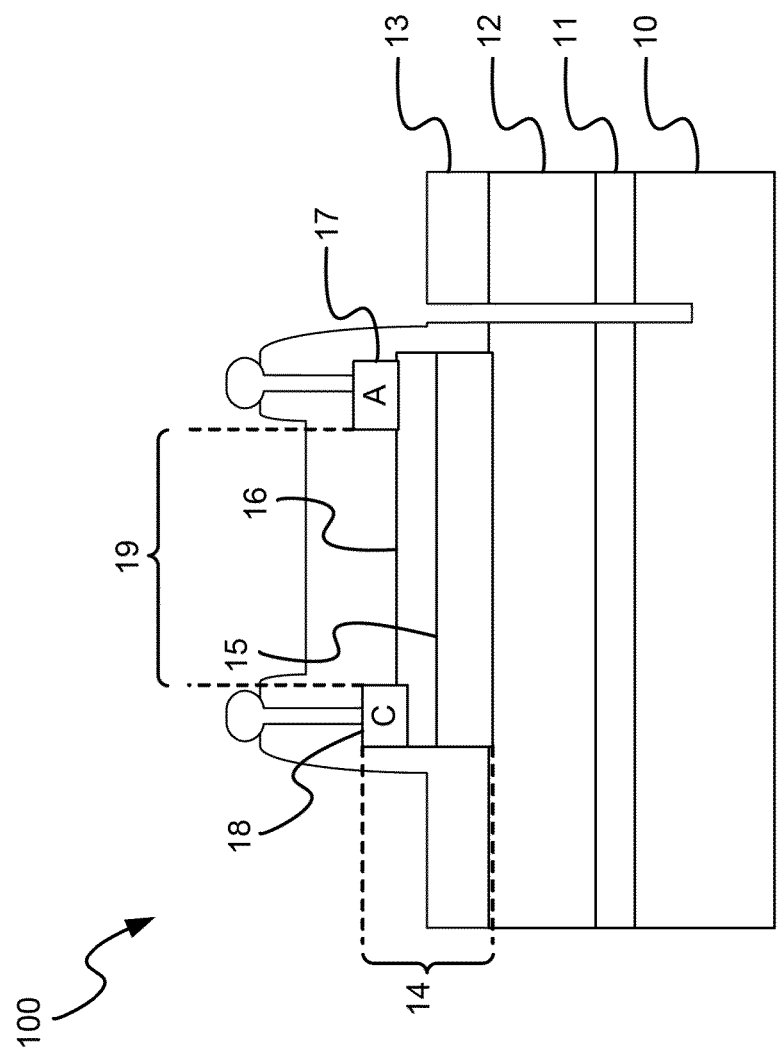
Figure 1C:
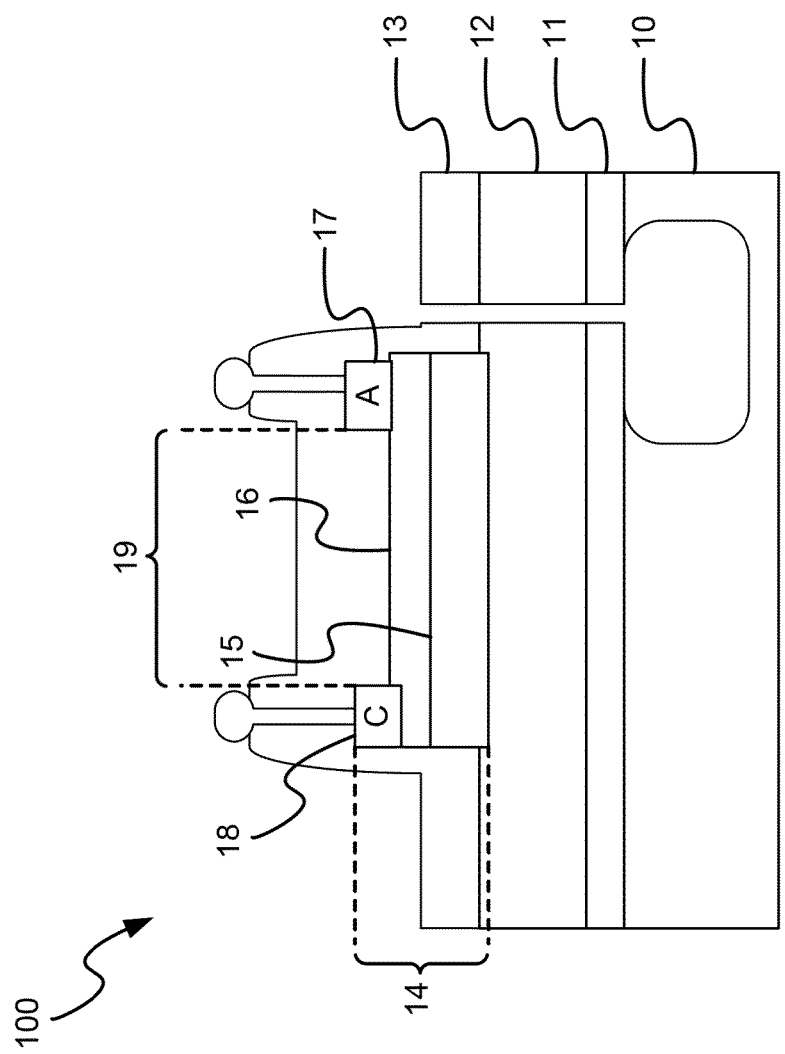
Figure 2A:
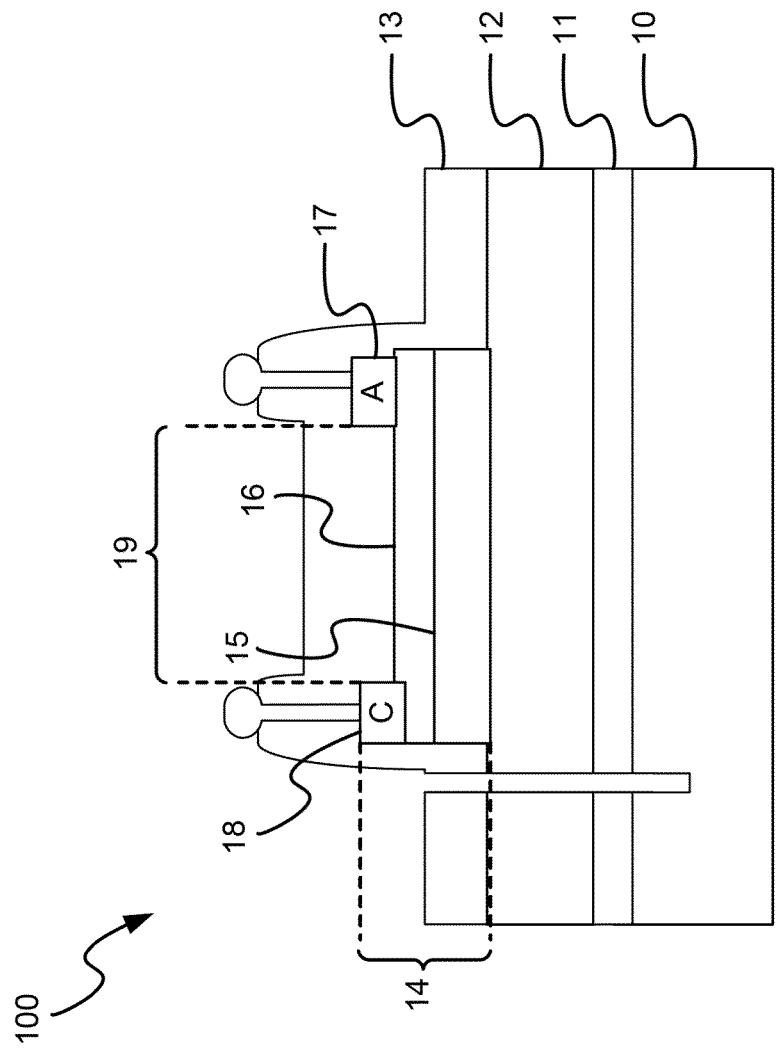
FIG. 2A is the sectional view showing the perpendicular etching of the second preferred embodiment.
Figure 2B:
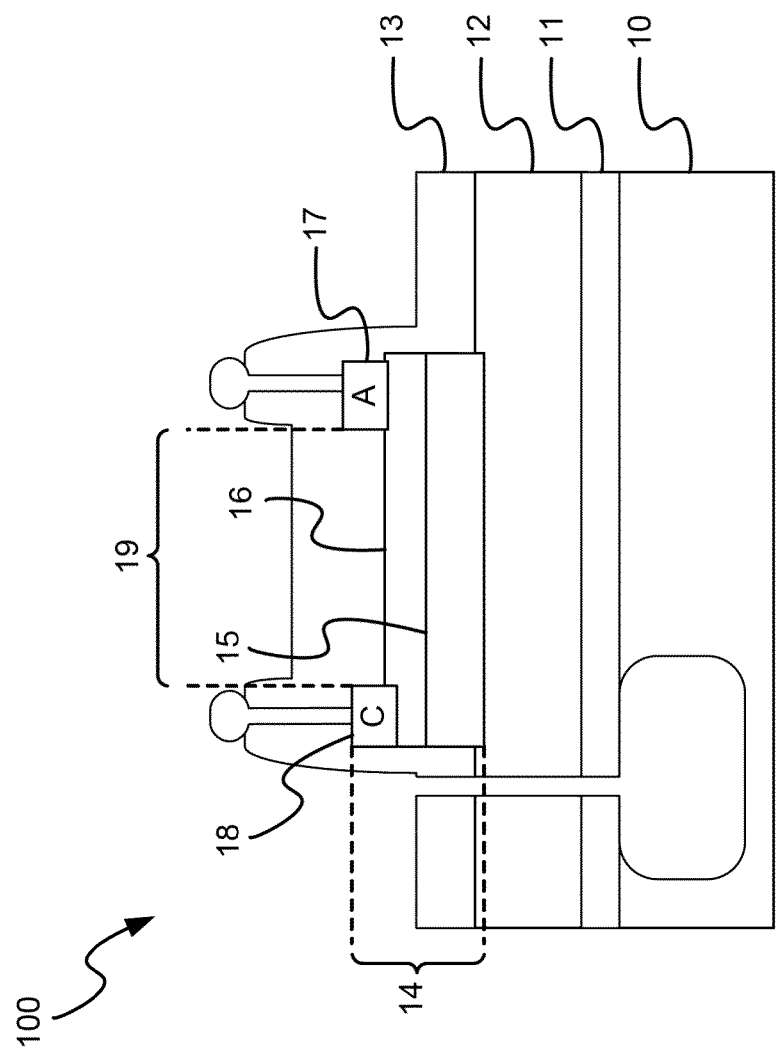
FIG. 2B is the sectional view showing the lateral etching of the second preferred embodiment.
Figure 3A:
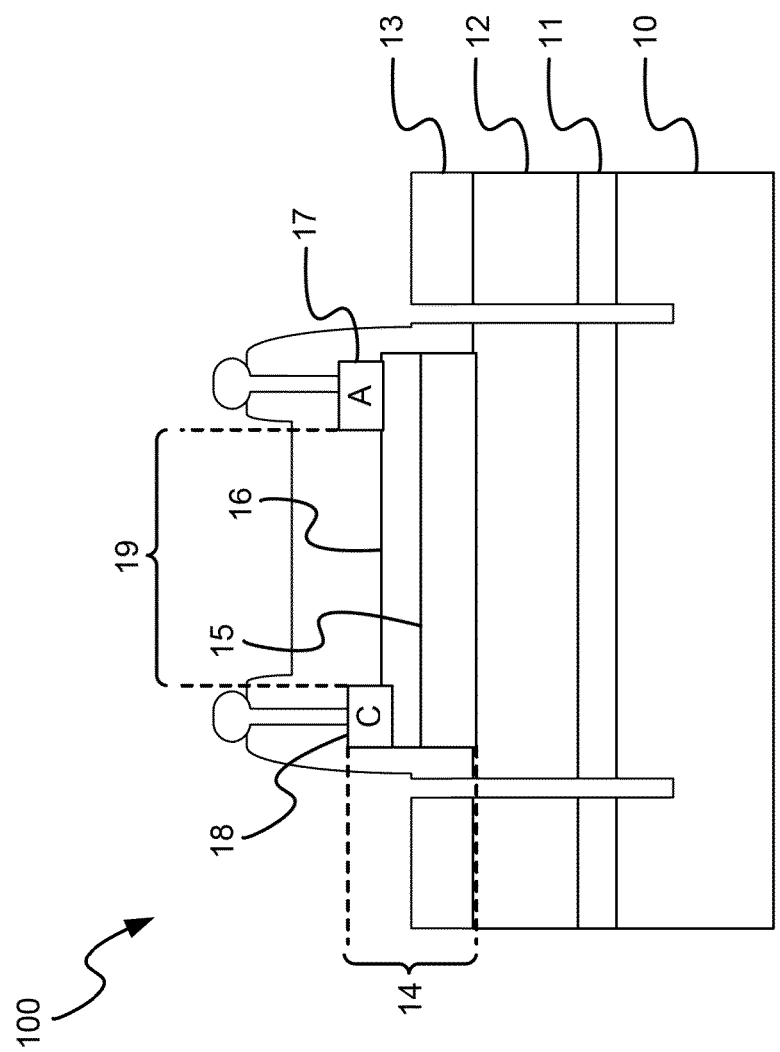
FIG. 3A is the sectional view showing the perpendicular etching of the third preferred embodiment.
Figure 3B:
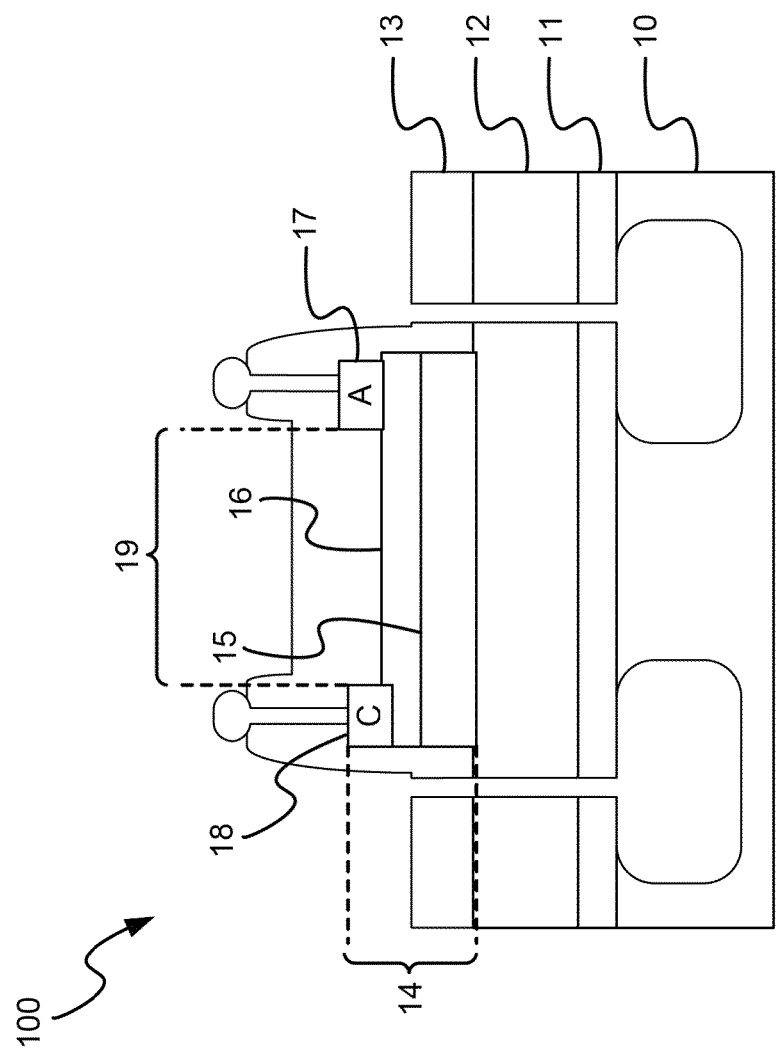
FIG. 3B is the sectional view showing the lateral etching of the third preferred embodiment.
Figure 4:
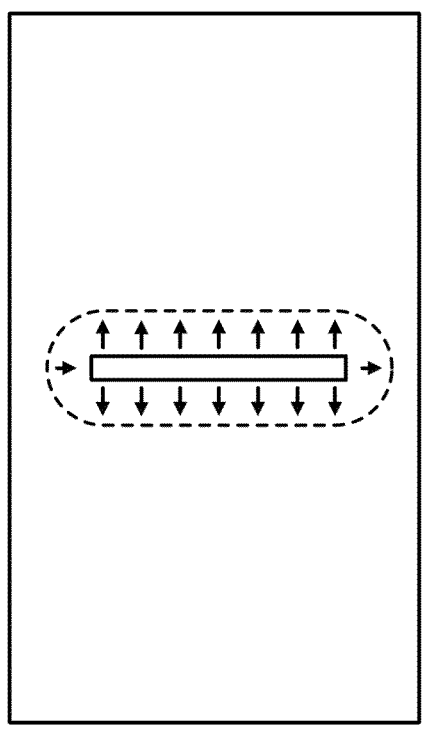
FIG. 4 is the view showing the continuous etching.
Figure 5:
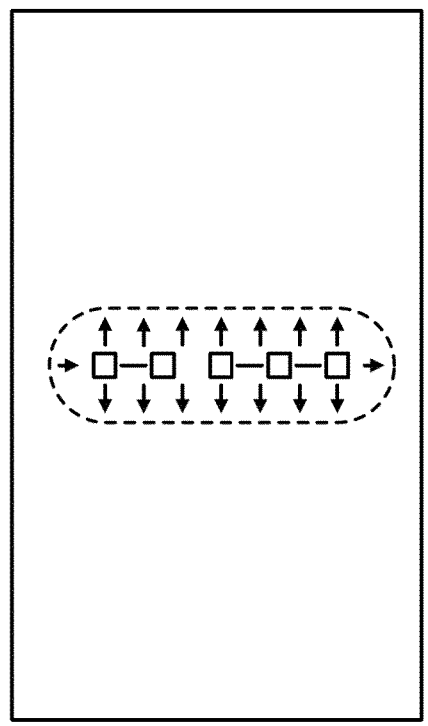
FIG. 5 is the view showing the discrete etching.

Please refer to FIG. 1A to FIG. 1C; FIG. 2A and FIG. 2B; FIG. 3A and FIG. 3B; FIG. 4; and FIG. 5, which are a sectional view showing an initial state of a diode device according to the present invention; sectional views showing perpendicular and lateral etchings of a first, a second and a third preferred embodiments; and views showing a continuous etching and a discrete etching. As shown in the figures, the present invention is a method of fabricating a III-nitride based semiconductor on a partial isolated silicon (Si) substrate, comprising the following steps:

(a) A diode device 100 is prepared. The diode device 100 is a nitride Schottky diode device, as shown in FIG. 1A. The diode device 100 is fabricated through the following steps:

(a1)) A Si substrate 10 is prepared. A nucleation layer 11 is formed on the Si substrate 10. A buffer layer 12 is formed on the nucleation layer 11. An active area 14 is formed on the buffer layer 12, which is isolated by an isolating part 13. A channel layer 15 is formed in the active area 14 on the buffer layer 12.

(a2) A barrier layer 16 is formed on the channel layer 15.

(a3) An anode 17 and a cathode 18 are formed on the barrier layer 16 or the channel layer 15. A drift area 19 is formed in the Si substrate 10 between the anode 17 and the cathode 18.

(b) After defining an etching area of the diode device 100, the diode device 100 is directly dry-etched or wet-etched from top to etch out the barrier layer 16, the channel layer 15, the buffer layer 12, the nucleation layer 11 and a part of the Si substrate 10. Therein, the etching area is defined inside or outside the active area 14 at an area near the anode 17; at an area near the cathode 18; or at both areas near the anode 17 and the cathode 18.

(c) An isotropic/non-isotropic lateral etching is processed to the Si substrate 10 until the drift area 19 of the diode device 100.

In step (a), the channel layer is made of III-nitride, like GaN, InN, AlN or their alloy, like AlGaN or AlInN; and, the barrier layer is made of a III-nitride or a nitride alloy, like AlGaN or AlInN.

In step (b), the dry etching is an etching using inductive couple plasma (ICP) or a reactive ion etching (RIE); and, a pattern is formed inside (in FIG. 4) or outside (in FIG. 5) of the active area by continuous etching or discrete etching.

In step (c), the lateral etching is a wet etching using a solution of NaOH, KOH, ethylenediamine pyrocatechol (EDP) or ramethyl ammonium hydroxide (TMAH); a plasma of a fluorine(F)-ion-containing gas, like $XeF_2$ and $XeF_4$; or a vapor of HF.

Thus, a novel method of fabricating a III-nitride based semiconductor on a partial isolated Si substrate is obtained.

In FIG. 1A to FIG. 1C, the heterojunction nitride Schottky diode device 100 is obtained in step (a) at first to be etched using inductive couple plasma (ICP) or reactive ion etching (RIE). The buffer layer 12, the nucleation layer 11 and a part of the Si substrate 10 are directly etched at an area outside of the active area 14 near the anode 17; and, then, F-ions laterally etch the Si substrate 10 right down the anode 17 of the diode device 100.

In FIG. 2A and FIG. 2B, the heterojunction nitride Schottky diode device 100 is obtained to be etched using ICP or RIE. The buffer layer 12, the nucleation layer 11 and a part of the Si substrate 10 are directly etched at an area outside of the active area 14 near the cathode 18; and, then, F-ions laterally etch the Si substrate 10 right down the cathode 18 of the diode device 100.

In FIG. 3A and FIG. 3B, a heterojunction nitride Schottky diode device 100 is obtained to be dry-etched or wet-etched. The buffer layer 12, the nucleation layer 11 and a part of the Si substrate 10 are etched at both areas outside of the active area 14 near the anode 17 and the cathode 18; and, then, the lateral etching is processed to etch the Si substrate 10 right down the anode 17 and the cathode 18.

Figure 6:
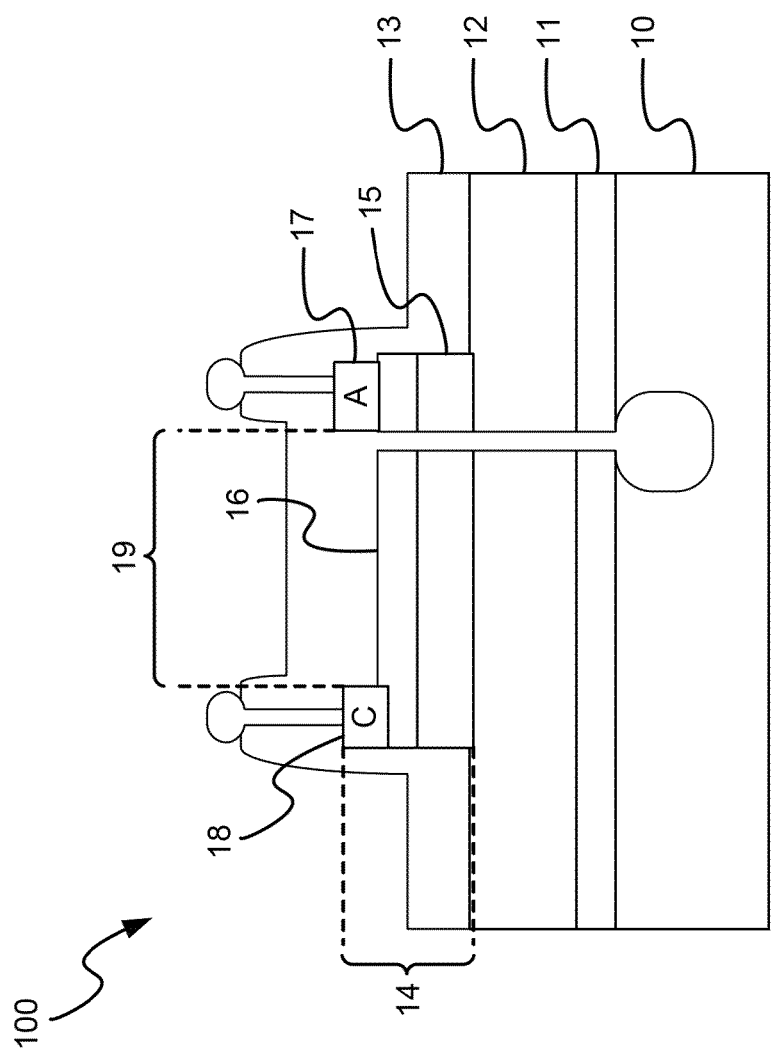
FIG. 6 is the sectional view showing the fourth preferred embodiment.
Figure 7:
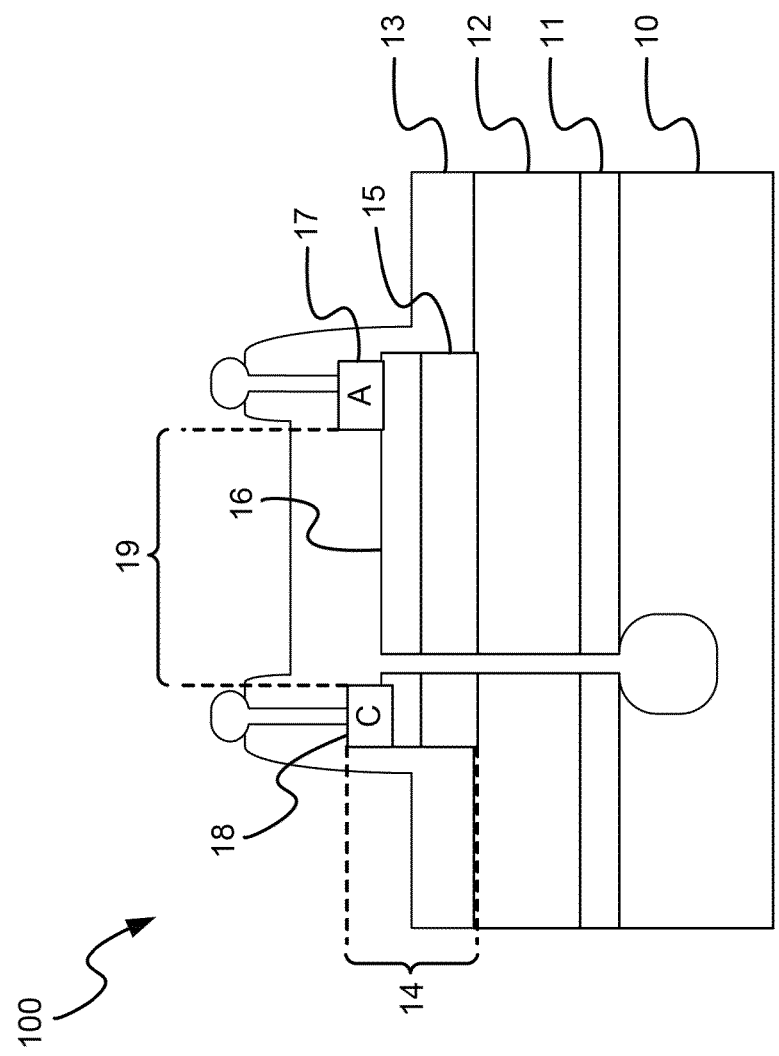
FIG. 7 is the sectional view showing the fifth preferred embodiment.
Figure 8:
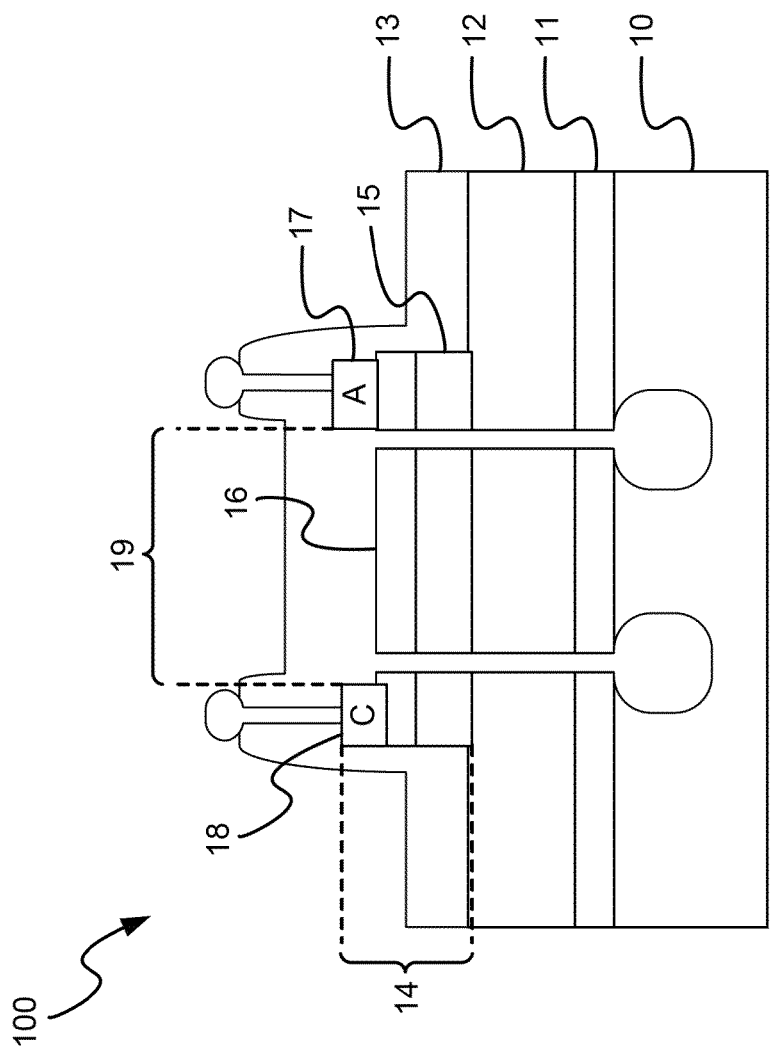
FIG. 8 is the sectional view showing the sixth preferred embodiment.
Figure 9:
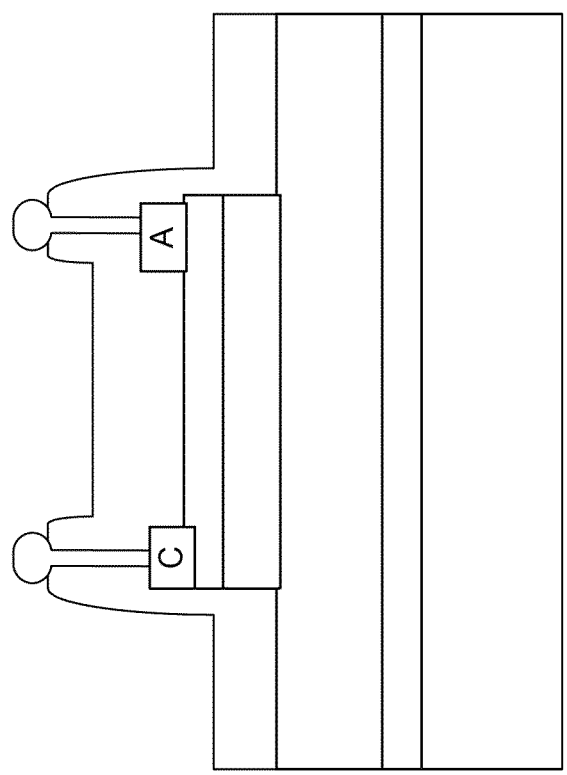
FIG. 9 is the sectional view of the prior art.
Figure 10:
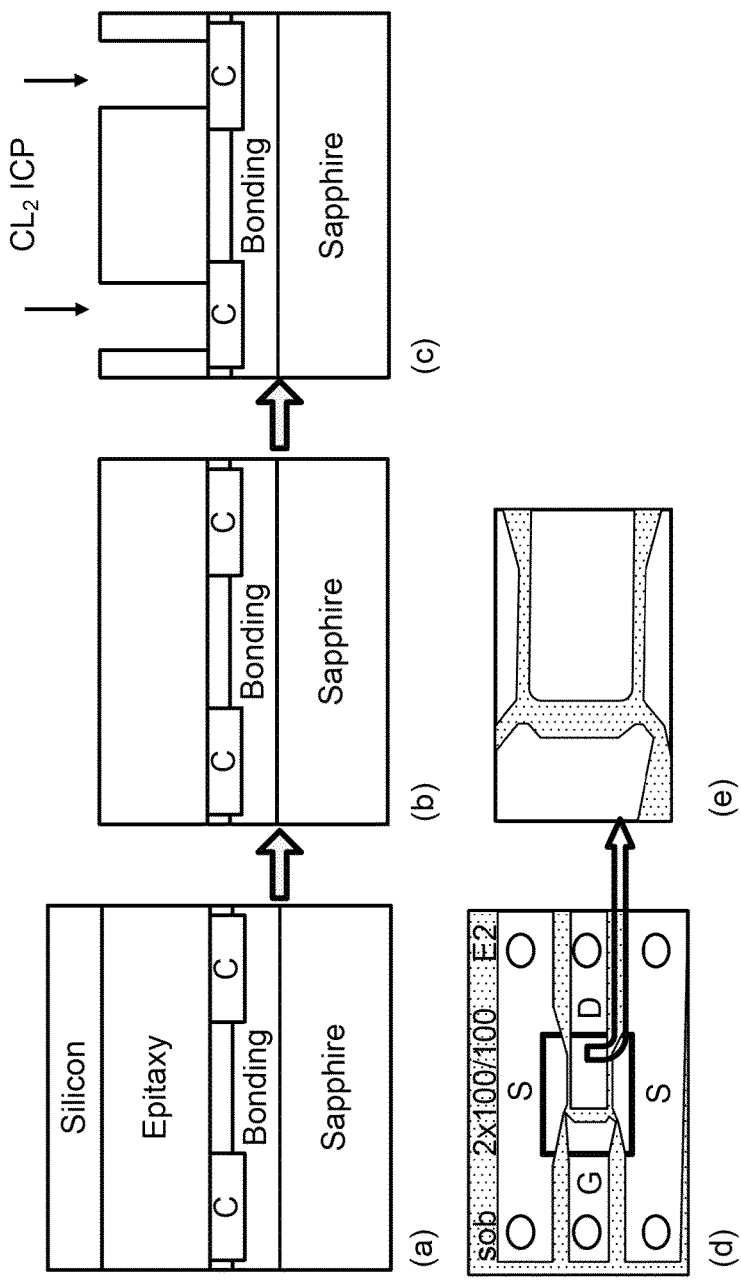
FIG. 10 is the view of the etching process of the prior art.
Figure 11:
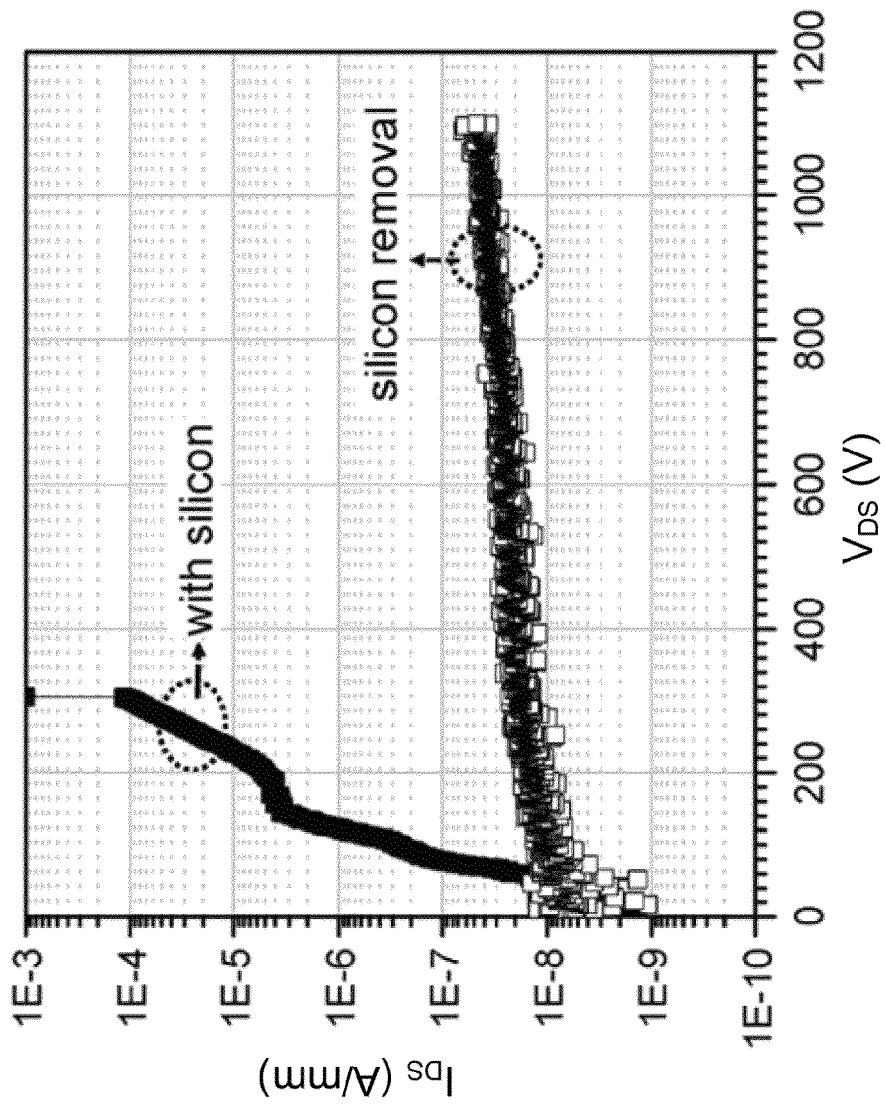
FIG. 11 is the view of the prior output voltage and current at the off state.
Figure 12:
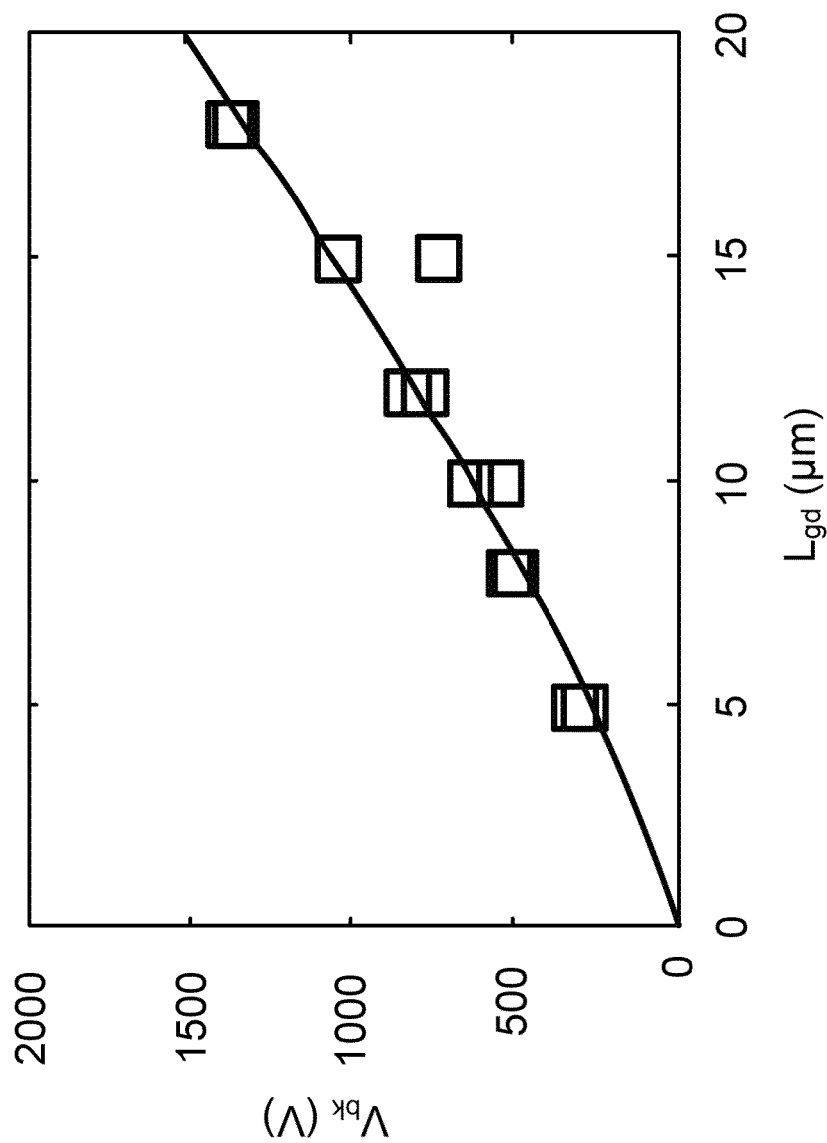
FIG. 12 is the view of the prior linear relation between the breakdown voltage and the drift area length.
Figure 13:
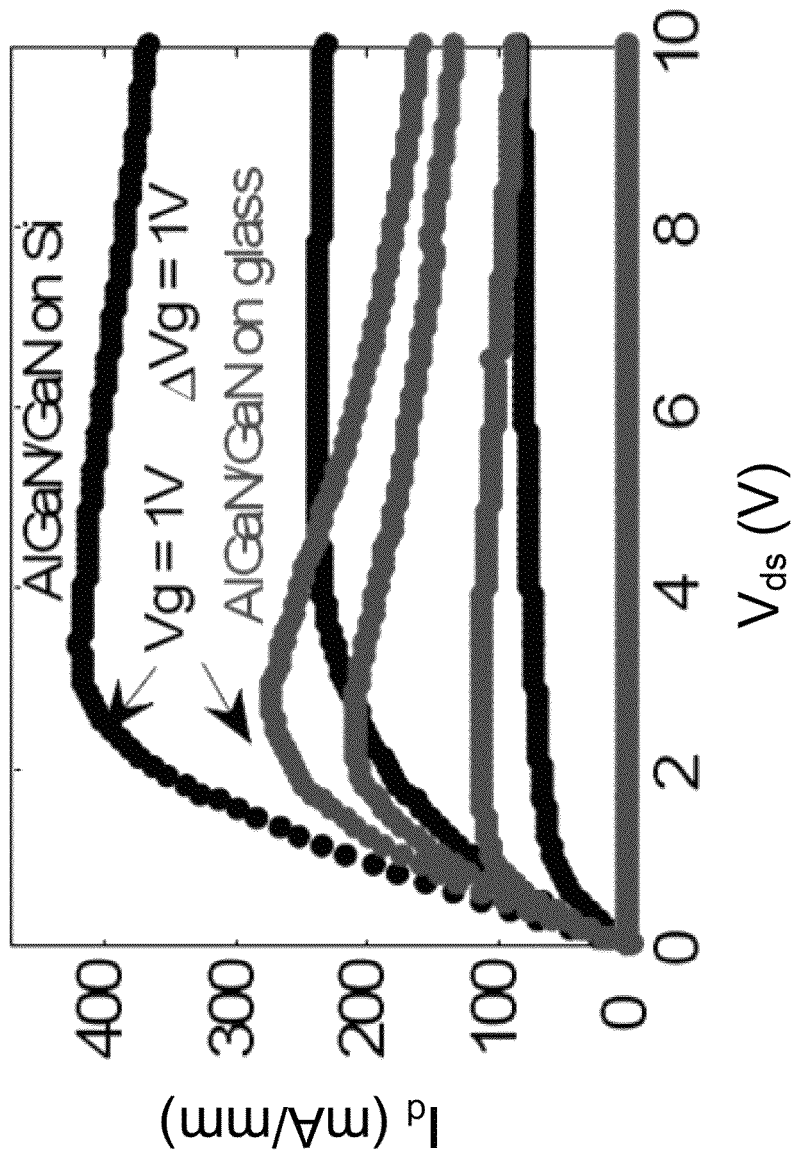
FIG. 13 is the view of the prior output voltage and current at the on state.

Please refer to FIG. 6 to FIG. 8, which are sectional views showing a fourth, a fifth and a sixth preferred embodiments. As shown in the figures, etchings are processed inside an active area.

In FIG. 6, a heterojunction nitride Schottky diode device 100 is obtained to be dry-etched or wet-etched. A barrier layer 16, a channel layer 15, a buffer layer 12, a nucleation layer 11 and a part of a Si substrate 10 are etched at an area inside an active area 14 near an anode 17; and, then, an isotropic/non-isotropic lateral etching is processed to etch the Si substrate 10 right down the anode 17.

In FIG. 7, the heterojunction nitride Schottky diode device 100 is obtained to be dry-etched or wet-etched. The barrier layer 16, the channel layer 15, the buffer layer 12, the nucleation layer 11 and a part of the Si substrate 10 are etched at an area inside the active area 14 near a cathode 18; and, then, the lateral etching is processed to etch the Si substrate 10 right down the cathode 18.

In FIG. 8, the eterojunction nitride Schottky diode device 100 is obtained to be dry-etched or wet-etched. The barrier layer 16, the channel layer 15, the buffer layer 12, the nucleation layer 11 and a part of the Si substrate 10 are etched at both areas inside the active area 14 near the anode 17 and the cathode 18; and, then, the lateral etching is processed to etch the Si substrate 10 right down both of the anode 17 and the cathode 18.

Thus, the present invention provides a method to etch a chip from top without transferring or deep-etching a silicon (Si) substrate from back-side. As a result, line width problem can be solved; and, the Si substrate does not need to be made thin for solving problems of complex fabrication procedure and bowing large-scaled chip. Hence, the present invention simplifies fabrication procedure, reduces production cost and is compatible with modern procedures. The present invention is suitable for producing large-scaled chips with enhanced breakdown voltages and suppressed leakage current. Moreover, the Si substrate does not need to be made thin and, therefore, the on-state current is not lowered and the thermal dissipation problem becomes small.

To sum up, the present invention is a method of fabricating a III-nitride based semiconductor on a partial isolated Si substrate, where a chip is directly etched from top without substrate transferring technique or deep-etching a Si substrate from back-side for solving line width problem; the Si substrate does not need to be made thin for solving the problem of complex fabrication procedure, the dissipation problem and the bowing problem of large-scaled chip without lowering the on-state current; and, thus, the present invention simplifies fabrication procedure, reduces production cost, is compatible with modern procedures and is suitable for producing large-scaled chips with enhanced breakdown voltages The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of fabricating a III-nitride based semiconductor on a partial isolated silicon (Si) substrate, comprising steps of:
   (a) obtaining a diode device, comprising steps of:
      (a1) obtaining a Si substrate; a nucleation layer on said Si substrate; a buffer layer on said nucleation layer; an active area on said buffer layer, said active area being isolated by an isolating part; and a channel layer located in said active area on said buffer layer;
      (a2) obtaining a barrier layer on said channel layer; and
      (a3) obtaining an anode and a cathode on a layer selected from a group consisting of said barrier layer and said channel layer; and obtaining a drift area in said Si substrate between said anode and said cathode;
   (b) defining an etching area of said diode device and directly etching said diode device from a first direction to etch out said barrier layer, said channel layer, said buffer layer, said nucleation layer and a part of said Si substrate,
   wherein said etching area is defined at an area selected from a group consisting of an area inside said active area and an area outside said active area; and
   (c) processing an isotropic/non-isotropic lateral etching to said Si substrate until said drift area of said diode device.

2. The method according to claim 1,
   wherein said diode device is a nitride Schottky diode device.

3. The method according to claim 1,
   wherein, in step (b), said barrier layer, said channel layer, said buffer layer, said nucleation layer and said part of said Si substrate are etched through a dry etching selected from a group consisting of an etching using inductive couple plasma (ICP) and a reactive ion etching (RIE).

4. The method according to claim 1,
   wherein, in step (b), etching is processed in said active area of said diode device through said barrier layer, said channel layer, said buffer layer, said nucleation layer and said part of said Si substrate.

5. The method according to claim 1,
   wherein, in step (b), etching is processed at peripheral edge of said active area of said diode device through said barrier layer, said channel layer, said buffer layer, said nucleation layer and said part of said Si substrate.

6. The method according to claim 1,
   wherein, in step (b), a pattern is obtained by etching through said barrier layer, said channel layer, said buffer layer, said nucleation layer and said part of said Si substrate and said etching is selected from a group consisting of a continuous etching and a discrete etching.

7. The method according to claim 1,
   wherein, in step (c), said lateral etching is processed in said etching area to etch said Si substrate right down said cathode/anode.

8. The method according to claim 1,
   wherein, in step (c), said lateral etching is a wet etching using a solution of a material selected from a group consisting of NaOH, KOH, ethylenediamine pyrocatechol (EDP) and tetramethyl ammonium hydroxide (TMAH).

9. The method according to claim 1,
   wherein, in step (c), said lateral etching uses a plasma of a fluorine(F)-ion-containing gas to etch said Si substrate and said F-ion-containing gas is selected from a group consisting of $XeF_2$ and $XeF_4$.

10. The method according to claim 1,
    wherein, in step (c), said lateral etching is processed at an area of said Si substrate adjacent to and vertically below said cathode and/or said anode in said active area of said diode device.

* * * * *